United States Patent [19]

Laker et al.

[11] 4,146,808

[45] Mar. 27, 1979

[54] THINNED WITHDRAWAL WEIGHTED SURFACE ACOUSTIC WAVE INTERDIGITAL TRANSDUCERS

[75] Inventors: Kenneth R. Laker, Staten Island, N.Y.; Thomas L. Szabo, Boston; Andrew J. Slobodnik, Jr., Malden, both of Mass.

[73] Assignee: The United States of America as represented by the Secretary of the Air Force, Washington, D.C.

[21] Appl. No.: 850,325

[22] Filed: Nov. 10, 1977

[51] Int. Cl.² .............................................. H01L 41/10
[52] U.S. Cl. ................................................... 310/313
[58] Field of Search ................ 310/313; 333/72, 30 R

[56] References Cited

U.S. PATENT DOCUMENTS 3,946,342   3/1976   Hartmann ........................ 310/313 X Primary Examiner—Mark O. Budd
Attorney, Agent, or Firm—Joseph E. Rusz; Willard R. Matthews, Jr.

[57] ABSTRACT

Passband distortion due to mass loading in withdrawal weighted surface acoustic wave transducers is substantially reduced by a thinning technique in which interdigital transducer electrodes are selectively withdrawn to synthesize a response function $H_o'(N)$. $H_o'(N)$ is a modified response function that has been scaled from a desired response function $H_o(N)$ by a thinning factor THIN. THIN is a positive, non-zero constant with a maximum value of unity. Thinned withdrawal weighted transducers fabricated in accordance with the technique have electrode weights that are normalized to less than unity and achieve mass loading reduction with a minimum amount of degradation of the desired response function.

4 Claims, 10 Drawing Figures

THINNED WITHDRAWAL WEIGHTED SURFACE ACOUSTIC WAVE INTERDIGITAL TRANSDUCERS

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave withdrawal weighted interdigital transducers and in particular to an electrode thinning technique that achieves mass loading reductions in such devices.

Surface acoustic wave (SAW) technology has become increasingly attractive for various signal processing applications, primarily because SAW devices can be fabricated to be compact, lightweight, and reliable using well established planar techniques. Many analog filter functions, not easily synthesized with classical techniques, can be realized with SAW transversal filters.

Over the years the length-weighted or apodized interdigital transducer has been the most important part of a SAW filter. A typical filter arrangement comprises a weighted interdigital transducer and an unweighted interdigital transducer. The weighted interdigital transducer accepts an electrical signal and converts it into acoustic waves. The second transducer samples, weights and integrates the incoming acoustic energy. The overall process is linear and reciprocal and can be expressed in terms of mathematical convolution or equivalently $$V_o/V_i = H(j\omega) = H_1(j\omega)H_2(j\omega)e^{-j\omega\tau_s} \quad (1)$$

where $\tau_s$ is the acoustic propagation delay between transducers. Because the unapodized transducer is often wideband, $H(j\omega)$ is approximately equal to the apodized response $H_1(j\omega)$ which is the Fourier transform of the apodization function of the transducer.

Even though apodization is conceptually simple, it is very difficult to achieve sidelobe levels below −50dB because of fabrication errors and diffraction distortions. Also, cascaded apodized IDT's fails to yield an overall response that equals the product of the individual responses (Eq. (1)). These drawbacks motivated the search for alternative weighting techniques such as phase weighting, capacitive weighting, series weighting and withdrawal weighting. Withdrawal weighting shows the greatest promise for complementing or replacing length apodized filters.

The basic objective of withdrawal weighting is to synthesize a desired bandpass response by selectively removing electrodes from what otherwise would be a uniform periodic array of electrodes. Unlike capacitive weighting and phase weighting, withdrawal weighting does not complicate or impose harsh requirements on device fabrication. Since a withdrawal weighted IDT launches a nearly plane acoustic wavefront, two of these IDT's can be placed in series within the same filter with minimal spectral and diffraction distortion.

Although withdrawal weighted transducers represent an improvement over devices using other weighting schemes they also have some undesirable characteristics. Most notable is the passband distortion which arises due to mass loading. Conventional withdrawal weighted transducers exhibit a velocity discontinuity between the metal electrodes and the substrate. There is also an impedance discontinuity which causes surface waves to be partially reflected by electrodes within the array. These internal reflections result in the aforementioned passband distortion. The present invention is directed toward providing withdrawal weighted interdigital transducers in which these undesirable characteristics are minimized.

SUMMARY OF THE INVENTION

The invention comprehends a thinned withdrawal weighted surface acoustic wave interdigital transducer and the method of fabricating it. The interdigital transducer of the invention can be obtained from the same procedure used to design conventional withdrawal weighted (WW) transducers (hereinafter described in detail) with the following modifications:

(1) Instead of using the usual given sample function $H_o(N)$ for $-NM N \leq N \leq NMAX$, it is replaced with a new sample function $H_o'(N)$ where $$H_o'(N) = \text{THIN}(H_o(N))$$

over the same limits of N, and the multiplier THIN is a positive, nonzero constant with a maximum value of unity. For conventional WW transducers, THIN = 1.0;

(2) Instead of using a normal seven center electrode sequence defined as $S(0) = 1,1,1,1,1,1,1$ (where 1 denotes the presence of an electrode) a thinned sequence is needed. For example for THIN = 0.4 a center electrode sequence of $S(0) = |AA|AA|$ is required where A denotes an absent electrode; and, (3) The center sequence S(0) is then used to initiate the withdrawal weighting procedure and the design proceeds in a normal manner for the revised sample function $H_o'(N)$. Several iterations are normally needed to achieve a stable design within specified tolerance bounds. Thus the thinning procedure including selections of THIN and S(0) may also require several iterations to obtain an acceptable design.

It is a principal object of the invention to provide a new and improved withdrawal weighted surface acoustic wave interdigital transducer.

It is another object of the invention to provide a withdrawal weighted acoustic wave interdigital transducer in which passband distortion due to mass loading is substantially reduced.

It is another object of the invention to provide a withdrawal weighted acoustic wave interdigital transducer that achieves mass loading reduction with a minimum amount of degradation of the desired response function.

These together with other objects features and advantages of the invention will become more readily apparent from the following detailed description when taken in conjunction with the illustrative embodiment of the accompanying drawings.

DETAILED DESCRIPTION OF THE PREFERRED EMBODIMENT

Figure 1:
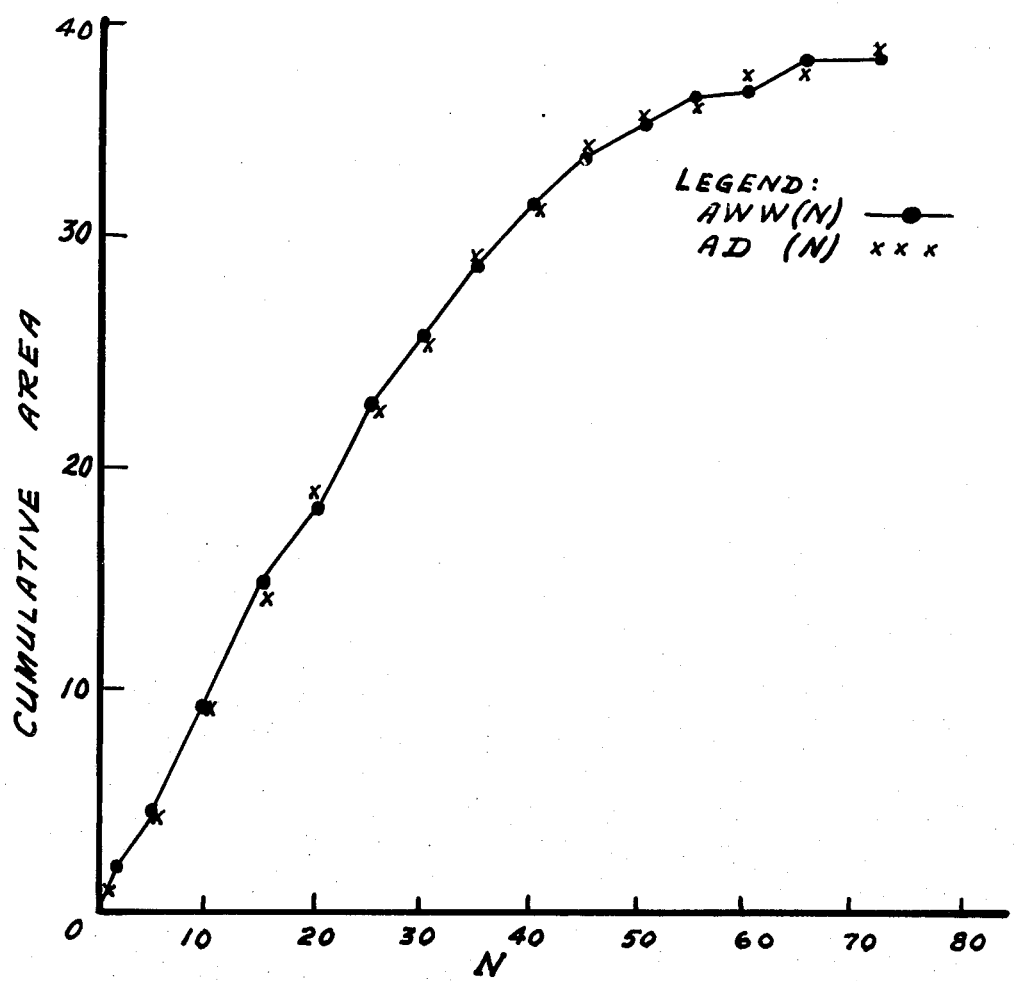
FIG. 1 illustrates typical design procedure tracking behavior: a comparison of AD(N) and AWW(N) versus sample N.

The object of surface wave filter design is to obtain a desired frequency response H(f) (where f = frequency). The filter response is the Fourier transform of the filter's impulse response hs(t), or H(f) = F [hs(t)], a well known result. Modifications to the basic interdigital transducer structure such as overlap (apodization) or withdrawal weighting is used to change the impulse response of the transducer in order to achieve the desired result. At high frequencies or whenever mass loading of transducer electrodes is significant, second order effects cause severe distortion and prevents the realization of filter response designs. The present invention comprehends the concept of "thinning", as a means for substantially reducing this type of distortion in withdrawal weighted transducers. A thinned withdrawal weighted transducer has fewer electrodes and a different electrode sequence than a conventional withdrawal weighted transducer. The conventional withdrawal weighting method is based on the selective withdrawal of electrodes from a full array. Those places where hs(t) is maximum or has peaks correspond to regions of full electrodes. For example a constant response hs(t) = 1.0 would ideally correspond to a full interdigital array of electrodes in which the sample function tap weights were $H_o(N) = 1.0$.

Practical implementation of the withdrawal method must account for the complicated electric field interactions among electrodes, and especially for changes in the environments of withdrawn electrodes. Electrodes can have effective "weights" (values usually less than 1.0) which can be tabulated for different nearest neighbor environments.

The starting point of a thinned design is the use of a parameter called "THIN", a positive nonzero number less than or equal to one. For a given response hs(t), the maximum value of electrode strength is usually never allowed to be greater than THIN in contrast to a value of one in a conventional withdrawal weighted transducer. Thus the sample function is scaled by THIN: $\hat{H}_o(N) = THIN \times \hat{H}_o(N)$. Because an electrode strength much less than one represents the case in which an electrode has few near neighbor electrodes, the THIN parameter reduces the number of electrodes necessary to realize the sample function. Even though undersampling is used, a frequency response of essentially the same desired shape is obtained since F [THIN hs(t)] = THIN H(f). Once this initial scaling of the sample function is done, the withdrawal weighted method proceeds in a normal manner. The net effect is enhanced electrode withdrawal or thinning, and the final electrode sequence in the transducer is completely unrelated to what would have been obtained by standard methods.

A general review of SAW withdrawal weighted filters together with a design procedure for realizing withdrawal weighted interdigital transducers and thinned withdrawal weighted transducers is now presented.

In order to obtain a filter having a desired impulse response H(jω), the SAW filter must be weighted in the time (or spatial) domain according to the Fourier transform of H(jω). This weighting is accomplished by either adjusting the length of the electrodes (apodization) or by reducing the number of electrodes in selected regions of a transducer (withdrawal weighting). As a design model idealization, the electrodes can be treated as perfect delta function samplers, sampling at time intervals of $\frac{1}{2}f_o$ where $f_o$ is given by the relation $f_o = V_s/\lambda_o$, $V_s$ is the SAW velocity, and $\lambda_o$ is twice the electrode center-to-center spacing. An alternating polarity electrode geometry results in a replication of H(jω) at odd multiples of $f_o$. Design at the fundamental is usually preferred because spurious bulk waves tend to degrade harmonic operation.

Actually, the electrodes are not perfect delta function samplers but sample according to the strength of their normal electric field distribution. The array configurations most widely used are constructed from either single electrodes or electrode pairs ("double electrodes") have alternating polarities. Each electrode has its own spectral response (including harmonics) and a more accurate accounting of this important physical mechanism is provided in a new design oriented spectral weighting model.

For an apodized IDT the $N^{th}$ tap weight $H_o(N)$ is proportional to the electrode length or overlap, L. For the withdrawal weighting scheme, the $N^{th}$ tap weight $\hat{H}_o(N)$ is a sensitive function of the electric field under that electrode as affected by the presence or absence of nearby electrodes. A symmetric electrode arrangements may impart an effective phase error, $d_o(N) = \nu_o(N)\lambda_o$, due to the phase slope of the normal electric field under the $N^{th}$ electrode. To compensate for these errors, the electrodes must be offset according to $d_c(N) = \nu_o\lambda_o$.

The ideal impulse and frequency responses of apodized and withdrawal weighted IDTs can be summarized as follows:

Apodized IDTs $$h_s(t) = \sum_{N=N_i}^{N_f} H_o(N) (-1)^N \delta(t - N/2f_o) \quad (2a)$$

and $$H(f) = F\{h_s(t)\} = \sum_{N=-N_i}^{N_f} H_o(N) (-1)^N e^{-jN\pi(f/f_o)} \quad (2b)$$

Withdrawal Weighted IDTs $$h_s(t) = \sum_{N=-N_i}^{N_f} \hat{H}_o(N) (-1)^N \delta(t - \tau(N)) \quad (3a)$$

and $$\hat{H}(f) = F\{h_s(t)\} = \sum_{N=-N_i}^{N_f} \hat{H}_o(N) (-1)^N e^{-jN\pi(f/f_o)} \quad (3b)$$

-continued $$e^{-j2\pi[\nu_c(N)-\nu_o(N)](f/f_o)}$$

where $N_i + N_f + 1 =$ total number of electrodes and $$\tau(N) = [N/2 + \nu_c(N) - \nu_o(N)]/f_o \quad (4)$$

The analysis and design of withdrawal weighted IDTs is severely complicated by the coupling which exists among the normal electric fields under each electrode. For design purposes, one can often assume that each electrode couples to only two or three of the nearest neighbor electrodes to its right and left. Values of $\hat{H}_o(N)$ and $d_o(N)$ which are necessary for design can be determined for any withdrawal weighting configuration. Tables suitable for double electrode arrays are given in various published articles. Tables of this nature are instrumental to the next section and can be found in published articles on the subject.

A procedure will now be described that sequentially determines the "best" ordering of equispaced electrodes and gaps for a withdrawal weighted IDT. The configuration is to be obtained such that an actual device can be constructed with a response that closely approximates, at least over a band of frequencies, the response of a specified filter. The primary task of the method is to decide whether or not an electrode should be placed at any given location in the array. The required decision is made by observing whether a time-domain response criterion is best satisfied by the presence or absence of the electrode. The step-by-step list, provided at the end of this section, aids in the discussion that follows:

At any stage of the design, a typical arrangement of electrodes (1) and gaps (A) about an electrode located at position N $\Delta t$ might appear as depicted below.

$$\begin{array}{cccccccccc} 1 & A & A & 1 & 1 & A & ? & ? & ? & \ldots ? \\ N-3 & N-2 & N-1 & N & N+1 & N+2 & N+3 & N+4 & N+5 & N_{MAX} \end{array} \quad (5)$$

The procedure decides whether or not to place an electrode at N+3. Once this has been determined, it moves on to consider N+4, etc. To reach these decisions various test functions, HWW$_1$(N) and HWW$_A$(N), are constructed. With respect to the configurations considered above, the test functions and related variables are defined as follows:

$$\text{HWW}_1(N) = 0.802204 = \hat{H}_o(N) \text{ for } 1 \text{ A A } \underline{1} \text{ 1 A 1} \quad ; \quad (6a)$$

$$\text{HWW}_A(N) = 0.767163 = \hat{H}_o(N) \text{ for } 1 \text{ A A } \underline{1} \text{ 1 A A} \quad ; \quad (6b)$$

$\hat{H}_o(N) =$ weight associated with withdrawal weighting configuration xxx1xxx. x denotes either a 1 or an A.
$H_D(N) =$ User specified points which define the desired sample function;

$$AWW(N) \simeq \Delta t \sum_{n=o}^{N} \hat{H}_o(n); \quad (7a)$$

$$AD(N) \simeq \Delta t \sum_{n=o}^{N} H_D(n); \quad (7b)$$

$$\Delta t = 1/f_o.$$

We may now define the error criterion used to build the withdrawal weighting configuration that most closely yields the desired frequency response H(f). The two trial functions are used to form the errors $$|\Delta A_1(N)| = |AD(N) - AWW_1(N)|, \text{ and} \quad (8a)$$

$$|\Delta A_A(N)| = |AD(N) - AWW_A(N)| \quad (8b)$$

The former is obtained from HWW$_1$(N), while the latter depends on HWW$_A$(N). If $|\Delta A_1(N)| < |\Delta A_A(N)|$, an electrode is placed at N+3; otherwise, a gap is inserted in position N+3. This procedure applies only when an electrode appears at N. On the other hand, if a gap is located at N, a different method must be employed. This situation is discussed below.

$H_o(N)$ is defined to be zero at a gap; consequently, a decision cannot be made in the manner described above as to whether or not an electrode should be placed at position N+3. These problems are handled y assigning an electrode at N+3 and seeing which combination of electrodes and gap at N+4, N+5 and N+6 minimizes a new error, namely, $$|AD(N+3) - AWW(N+3) - \tau'|.$$

Figure 2:
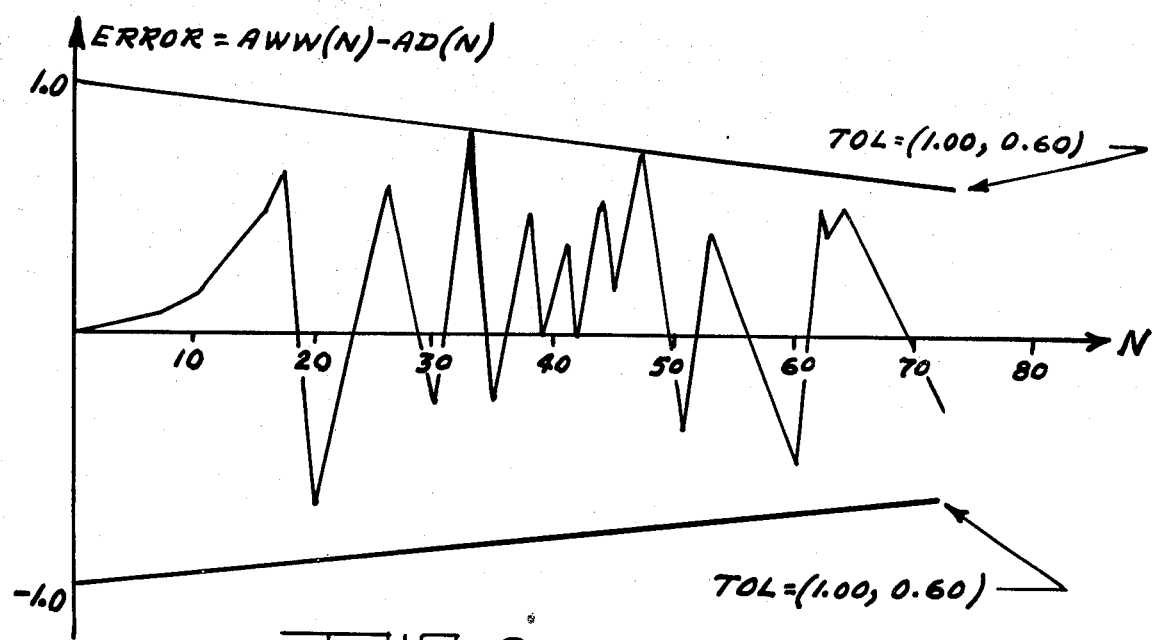
FIG. 2 illustrates typical design procedure tracking behavior: error −AWW(N)−AD(N) versus sample N.

Parameter $\tau'$ plays the role of a local tolerance level that acts to distribute the cumulative errors over the interval [N,N+3]. When this error is distributed more uniformly, the error at any given location can usually be prevented from exceeding the bounds of a predefined, linearly varying tolerance function TOL(N). The design process may now be continued until a full array configuration of electrodes and gaps has been determined. FIGS. 1 and 2 illustrate the variation of AWW(N) and AD(N) when these design procedures are adopted.

It has been found that the frequency response of the simulated IDT can be improved if the procedure described above is iterated upon. Briefly, after the design configuration is obtained, the design sequence returns to that location N = $\tilde{K}$ where $|\Delta A|$ first exceeded the bounds of TOL(N). The configuration in the vicinity of $\tilde{K}$ may then be altered to bring $|\Delta A|$ below this tolerance. The design then proceeds to the next point beyond N = $\tilde{K}$. If the tolerance function is not excessively tight, then at some location N>$\tilde{K}$, $|\Delta A|$ would again exceed the tolerance level. But, for all N less than this new $\tilde{K}$, $|\Delta A|$ would be less than the tolerance level. In this way, after 15 to 30 cycles, $\tilde{K}$ would eventually reach the last electrode in the array, and the design is complete. FIG. 2 indicates how cumulative error varied in one case that was studied. It should be mentioned that if the tolerance function is "too limiting" this refinement of the design is not stable, and $\tilde{K}$ may never reach the end of the array. In such instances, very large errors build up toward the edge of the array with subsequent degradation in the frequency response characteristics.

OUTLINE OF DESIGN PROCEDURES

1. Specify input parameters and desired sample response, $H_D(N)$.
2. Form AD(N) from $H_D(N)$ according to Eq. (7b).
3. Is an electrode present at location N?
   NO: Execute code in I; go to 4
   YES: Continue
4. Compute trial functions HWW$_1$(N), HWW$_A$(N), AWW$_1$(N), AWW$_A$(N).
5. Is $|AD(N) - AWW_1(N)| < |AD(N) - AWW_A(N)|$?

NO: Place a gap at N+3; go to 6
YES: Place electrode at N+3; continue
6. Is this the first location encountered during this cycle where $|\Delta A| > TOL(N)$
   NO: Go to 7
   YES: Define $\tilde{K} = N$; continue
7. Is location under consideration near the end of the array?
   NO: Go to 3
   YES: Assign electrodes and gas as best as possible to minimize $|\Delta A|$ for the end of the array; continue
8. Is $\tilde{K} \geq (NMAX - 3)$?
   NO: Execute code in II; go to 3
   YES: (Design is complete for tolerances used); continue
9. Determine and plot frequency response according to the spectral weighting model. Record data which give the array location of each electrode.
10. Consider new parameters, if there are any, and go to 2; otherwise, END the procedure.

I. Based on absence of M' consecutive electrodes starting at position N; assign electrodes and vacancies over $[N+M', N+M'+3]$ such that $|\Delta A(N+M')-Y'(M')| < TOL(N+M')$, where $m = M'$.

II. Set $N \leftarrow \tilde{K}$; alter configuration in vicinity of N so that $|\Delta A(N)| < TOL(N)$.

Figure 3:
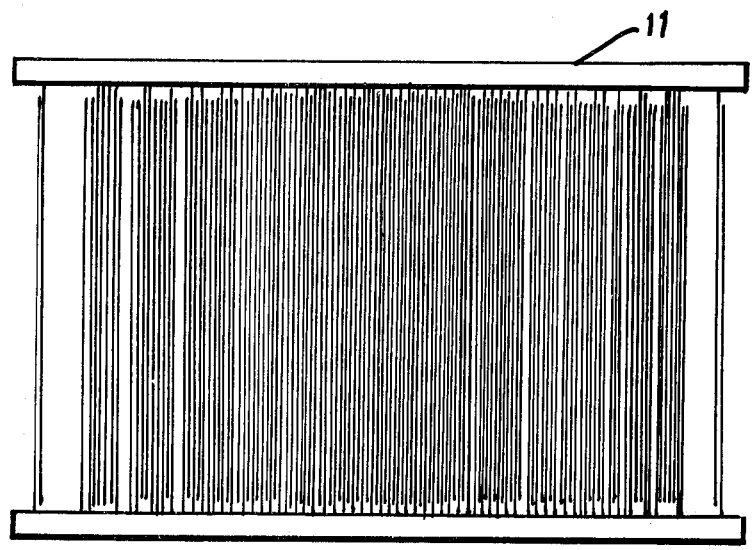
FIG. 3 illustrates an unthinned withdrawal weighted interdigital transducer.
Figure 4:
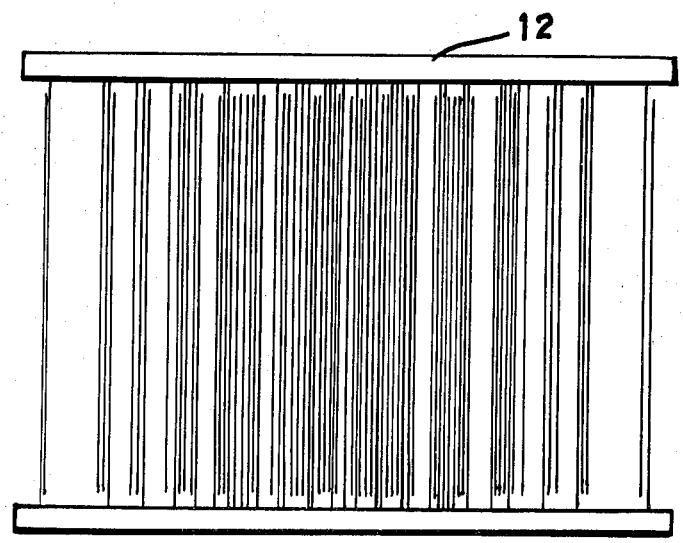
FIG. 4 illustrates an equivalent thinned (THIN = 0.4) withdrawal weighted interdigital transducer.
Figure 5:
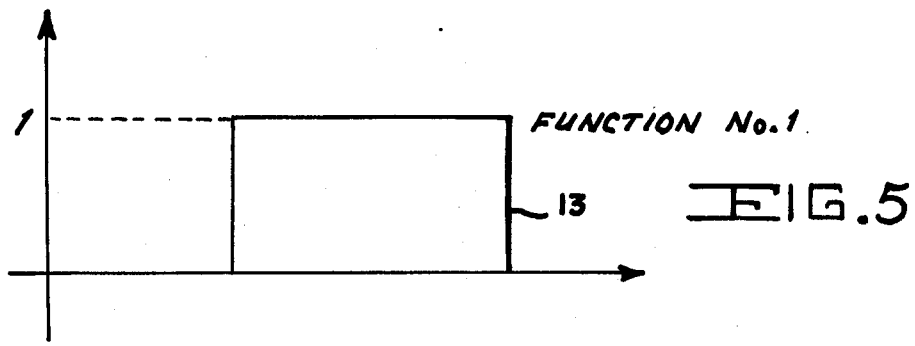
FIG. 5 is an example of the limiting use envelope of a sampling function used for conventional withdrawal weighted synthesis.
Figure 6:
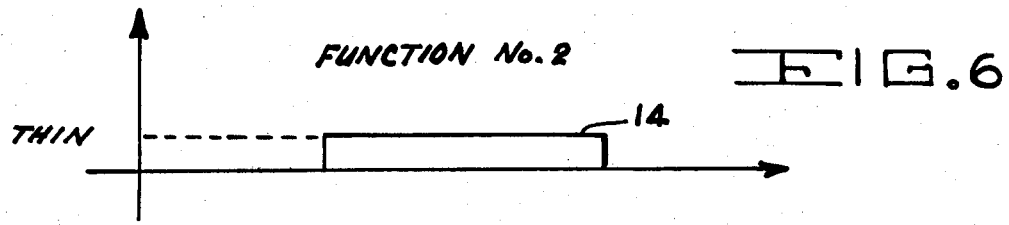
FIG. 6 is an example of the limiting use envelope of a sampling function used for thinned withdrawal weighted synthesis.
Figure 7:
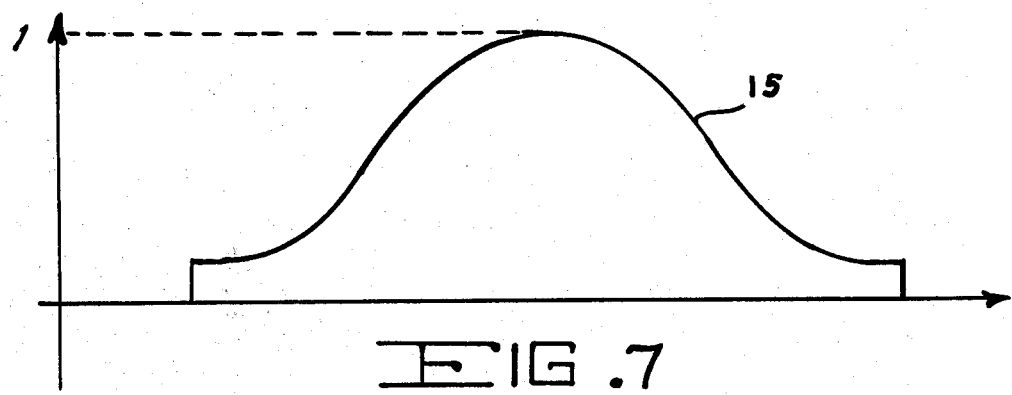
FIG. 7 is a typical envelope of a sampling function used for conventional withdrawal weighted synthesis.
Figure 8:
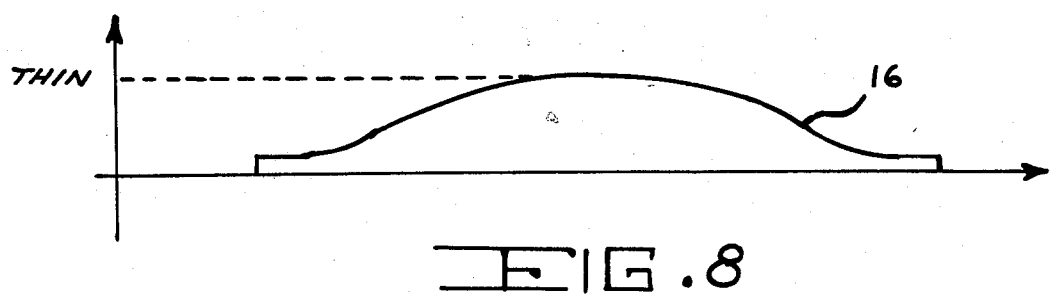
FIG. 8 is a typical envelope of a sampling function used for thinned withdrawal weighted synthesis.

Both conventional (prior art, shown by unthinned IDT of FIG. 3) and thinned (the subject of this invention shown by thinned IDT 12 of FIG. 4,) withdrawal weighted transducers are realized according to the general procedures given above. However, for thinned withdrawal weighted transducers the following points must be followed:

(1) Instead of using the usual given sample function $H_o(N)$ for $-NMIN \leq N \leq NMAX$, it is replaced with a new sample function $H_o'(N)$ where $$H_o'(N) = THIN [H_o(N)]$$

over the same limits of N, and the multiplier THIN is a positive, nonzero constant with a maximum value of unity. For conventional withdrawal weighted transducers, THIN = 1.0. This point is the key difference between conventional and thinned withdrawal weighted transducers. This can be illustrated with reference to FIGS. 5 and 6 which show two envelopes 13, 14 of sample function. These are limiting cases or constant sample functions. Neglecting end effects, consider synthesizing function No. 1 (envelope 13 in FIG. 5) using the conventional withdrawal weighting procedure. In this case the result is the limiting case of a filled-in array or conventional interdigital transducer. Here each electrode in the array has an equal weight by definition, of units; therefore, function No. 1 which as a height of unity requires a fully array. On the other hand, the realization of function No. 2 in FIG. 6, which as a height of THIN requires electrodes which have a weight of nearly THIN. Only electrodes which have missing neighbors (corresponding to thinned sequences, of electrodes), can meet this requirement. Electrodes of unity weight would cause large errors if they were used to synthesize function No. 2. The transducers used to realize functions 1 and 2 therefore would have completely different structures. For the second function, the array would have far fewer electrodes, or it would be "thinned".

(2) Instead of using a normal seven center electrode sequence defined as $S(0) = 1,1,1,1,1,1,1$ (where 1 denotes the presence of an electrode) a thinned sequence is needed. For example for THIN = 0.4 (as in FIG. 4) a center electrode sequence of $S(0) = |AA|AA|$ was required where A denotes an absent electrode. This follows directly from the foregoing discussion.

Figure 9:
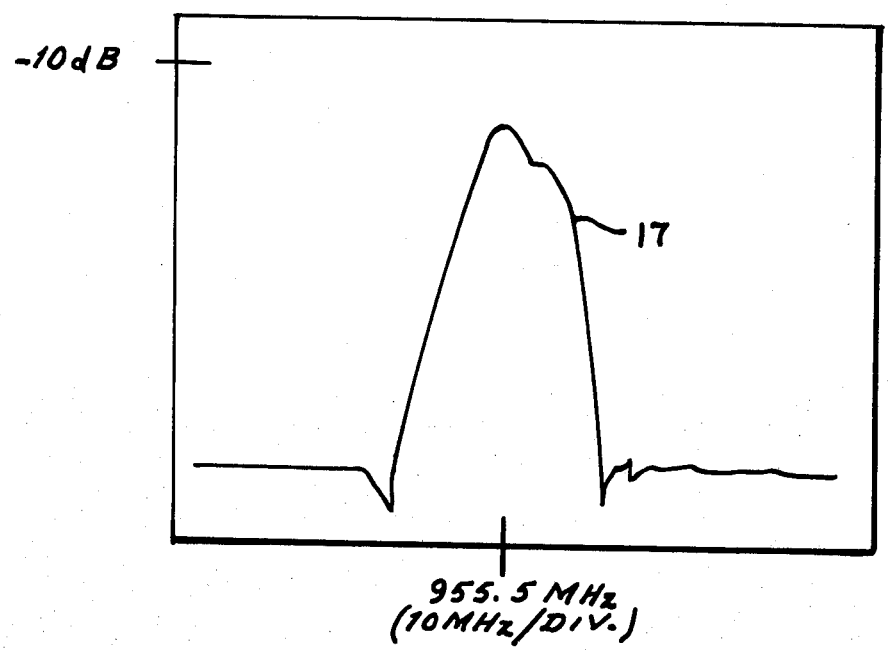
FIG. 9 is a response to a SAW transversal filter comprised of two conventional withdrawal weighted interdigital transducer.
Figure 10:
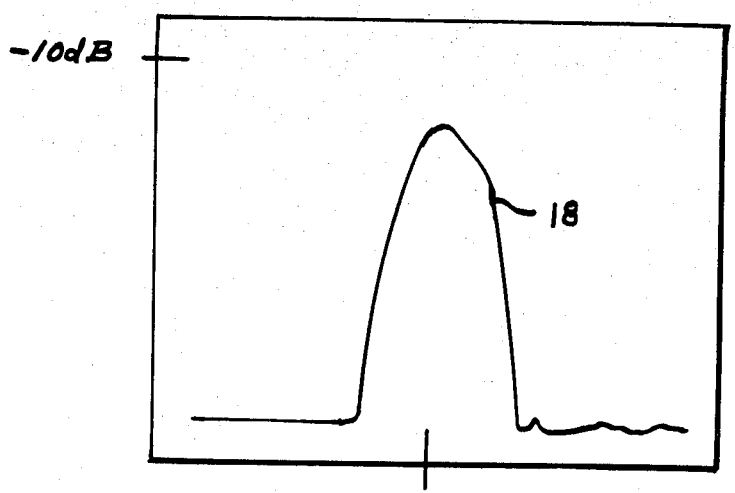
FIG. 10 is a response to a SAW transversal filter comprised of two thinned withdrawal weighted interdigital transducers.

The center sequence S(0) is then used to initiate the withdrawal weighting design procedures which continue in a normal manner for the revised sample function $H_o'(N)$. As explained above, several iterations are normally needed to achieve a stable design within specified tolerance bounds. Thus, the thinning procedure including selections of THIN and S(0) may also require several iterations to obtain an acceptable design. A comparison of the frequency responses of thinned and unthinned withdrawal weighted filters is provided by curves 17 and 18 of FIGS. 9 and 10. The reduced mass loading of the thinned design is clearly evident from the peak of curve 18 in FIG. 10.

While the invention has been described in one presently preferred embodiment it is understood that the words which have been used are words of desription rather than words of limitation and that changes with the purview of the appended claims may be made without departing from the scope and spirit of the invention in its broader aspects.

What is claimed is:

1. A method for fabricating a surface acoustic wave interdigital transducer comprising the steps of
   defining a preselected response function $H_o(N)$,
   selecting a thinning factor THIN, said thinning factor THIN being a positive non-zero number with a maximum value of less than unity,
   scaling said response function $H_o(N)$ by said thinning factor to provide a modified response function $H_o'(N)$,
   fabricating an interdigital transducer having opposing sets of overlapping electrodes, and
   withdrawing electrodes to synthesize said modified response function $H_o'(N)$.

2. The method for fabricating a surface acoustic wave interdigital transducer defined in claim 1 wherein said thinning factor THIN is a value that provides maximum interdigital transducer loading reduction and not more than acceptable preselected response function degradation.

3. A surface acoustic wave interdigital transducer having a response function $H_o'(N)$, said response function $H_o'(N)$ being a preselected idealized response function $H_o(N)$ scaled by a thinning factor THIN, said thinning factor THIN being a positive non-zero number with a maximum value of less than unity, said transducer comprising
   opposed sets of overlapping electrodes, said electrodes being in appropriate quantity and arrangement to synthesize said response function $H_o'(N)$.

4. A surface acoustic wave interdigital transducer as defined in claim 3 wherein said thinning factor THIN is a value that provides maximum interdigital transducer loading reduction and not more than acceptable preselected idealized response function degradation.

* * * * *